United States Patent
Taira et al.

[11] Patent Number: 6,153,977
[45] Date of Patent: Nov. 28, 2000

[54] ECR TYPE PLASMA GENERATING APPARATUS

[75] Inventors: Tetsusaburo Taira; Yasusaburou Takano, both of Tokorozawa, Japan

[73] Assignee: Tokyo Seihinkaihatsu Kenkyusho, Tokorozawa, Japan

[21] Appl. No.: 09/286,466

[22] Filed: Apr. 6, 1999

[51] Int. Cl.[7] .............................. H01J 7/24; H05B 31/26
[52] U.S. Cl. ................................ 315/111.41; 315/111.51; 118/723 I; 118/723 AN
[58] Field of Search .......................... 315/111.41, 111.51, 315/111.71; 156/345; 118/723 I, 723 IR, 723 AN

[56] References Cited

U.S. PATENT DOCUMENTS 5,173,640  12/1992  Geisler et al. ..................... 315/111.41

FOREIGN PATENT DOCUMENTS 7-36359   4/1995  Japan .
7-107877  11/1995 Japan .

*Primary Examiner*—Michael B Shingleton
*Attorney, Agent, or Firm*—Armstrong, Westerman, Hattori, McLeland & Naughton

[57] ABSTRACT

In a plasma generating apparatus utilizing electron cyclotron resonance, comprising a vacuum vessel capable of maintaining a vacuum state therein, an antenna for radiating electromagnetic waves into the vacuum vessel, a permanent magnet for forming a resonance magnetic field, and an outer sleeve made of an insulator and accommodating the permanent magnet therein, the outer sleeve being permeable to lines of magnetic force and having air tightness, two permanent magnets are arranged to form the resonance magnetic field in a spaced relation with the same polarity poles of the permanent magnets facing each other. With this ECR type plasma generating apparatus, a resonance region is increased so that various plasma processes can be uniformly performed over a wider region.

4 Claims, 3 Drawing Sheets

ECR TYPE PLASMA GENERATING APPARATUS

BACKGROUND OF THE INVENTION

1. Field of the Invention

The present invention relates to an apparatus for generating plasma utilizing electron cyclotron resonance (ECR)

2. Description of the Related Art

In the field of manufacture of semiconductors, etc., there is known and practiced an apparatus in which ECR is developed in a rarefied gas to generate plasma while electromagnetic waves are supplied to a resonance magnetic field. An improvement of such an ECR type plasma generating apparatus has been proposed which employs a permanent magnet as a magnet for generating the resonance magnetic field, and is installed in a vacuum to perform the plasma CVD (chemical vapor deposition) (see Japanese Patent No. 2,011,461, "Plasma Generating Apparatus"). This improved plasma generating apparatus has such advantages that the structure is simple and compact, and plasma can be locally produced with high flexibility of design. However, when the apparatus including a permanent magnet is arranged in a vacuum, the following problems occur. If the permanent magnet is made of a porous material or a material containing an organic binder, gas is vigorously released from the material upon heating in the plasma generating process. Magnetic powder is sputtered from the permanent magnet into the vacuum. Further, it is difficult to cool the permanent magnet.

Those problems occurred with arrangement of a permanent magnet in a vacuum have been overcome by another improvement of the ECR type plasma generating apparatus which comprises a vacuum vessel capable of maintaining a vacuum state therein, an antenna for radiating electromagnetic waves into the vacuum vessel, apermanent magnet for forming a resonance magnetic field, and an outer sleeve made of an insulator and accommodating the permanent magnet therein, the outer sleeve being permeable to lines of magnetic force and having air tightness (see Japanese Patent No. 2,080,292, "Plasma Generating Apparatus Utilizing Electron Cyclotron Resonance").

However, the plasma generating apparatus employing the permanent magnet, disclosed in the above Japanese Patents, still have such a disadvantage that a produced resonance region is limited. More specifically, as well known, both N and S poles always exist in the same solid body of a permanent magnet, and lines of magnetic force generate from the N pole and terminate at the S pole. Because of this specific property, the permanent magnet cannot distribute a resonance magnetic field over a so wide space as covered by lines of electric force, thus resulting in a restricted region where plasma can be produced.

SUMMARY OF THE INVENTION

An object of the present invention is to increase a resonance region in an ECR type plasma generating apparatus employing a permanent magnet so that various plasma processes can be uniformly performed over a wider region in match with ever increasing size of targets to be processed.

To achieve the above object, the present invention is constructed as follows. In a plasma generating apparatus utilizing electron cyclotron resonance, comprising a vacuum vessel capable of maintaining a vacuum state therein, an antenna for radiating electromagnetic waves into the vacuum vessel, a permanent magnet for forming a resonance magnetic field, and an outer sleeve made of an insulator and accommodating the permanent magnet therein, the outer sleeve being permeable to lines of magnetic force and having air tightness, two permanent magnets are arranged to form the resonance magnetic field in a spaced relation with the same polarity poles of the permanent magnets facing each other.

Preferably, the insulator is made of a ceramic. In this case, the present invention resides in a plasma generating apparatus utilizing electron cyclotron resonance, comprising a vacuum vessel capable of maintaining a vacuum state therein, an antenna for radiating electromagnetic waves into the vacuum vessel, a permanent magnet for forming a resonance magnetic field, and a ceramic outer sleeve accommodating the permanent magnet therein, the outer sleeve being permeable to lines of magnetic force and having air tightness, wherein two permanent magnets are arranged to form the resonance magnetic field in a spaced relation with the same polarity poles of the permanent magnets facing each other.

Preferably, the outer sleeve is permeable to electromagnetic waves, and the antenna is also accommodated in the outer sleeve. In this case, the present invention resides in a plasma generating apparatus utilizing electron cyclotron resonance, comprising a vacuum vessel capable of maintaining a vacuum state therein, an antenna for radiating electromagnetic waves into the vacuum vessel, a permanent magnet for forming a resonance magnetic field, and a ceramic outer sleeve accommodating the permanent magnet therein, the outer sleeve being permeable to lines of magnetic force and electromagnetic waves and having air tightness, wherein two permanent magnets are arranged to form the resonance magnetic field in a spaced relation with the same polarity poles of the permanent magnets facing each other.

Preferably, the antenna and the two permanent magnets are arranged in a coaxial relation, and the electromagnetic waves are supplied from the center of a cusp-shaped magnetic field. In this case, the present invention resides in a plasma generating apparatus utilizing electron cyclotron resonance, comprising a vacuum vessel capable of maintaining a vacuum state therein, an antenna for radiating electromagnetic waves into the vacuum vessel, a permanent magnet for forming a resonance magnetic field, and a ceramic outer sleeve accommodating the permanent magnet therein, the outer sleeve being permeable to lines of magnetic force and electromagnetic waves and having air tightness, wherein two permanent magnets are arranged coaxially with the antenna to form the resonance magnetic field in a spaced relation with the same polarity poles of the permanent magnets facing each other, and the electromagnetic waves are supplied from the center of a cusp-shaped magnetic field.

DESCRIPTION OF THE PREFERRED EMBODIMENT

To enlarge a resonance magnetic region, where plasma can be produced, in the ECR type plasma generating apparatus employing a permanent magnet, it has been a common sense that the permanent magnet must be itself increased to distribute a magnet field over a wide space, or that a number of permanent magnets must be arranged adjacent to each other to provide a condition apparently equivalent to that of a single large-size permanent magnet. The present invention has been accomplished based on such a finding that, by arranging two permanent magnets in a spaced relation with the same polarity poles of the permanent magnets facing each other, it is possible to distribute the lines of magnetic force and hence to produce plasma over a wide region.

According to the present invention, in an ECR type plasma generating apparatus employing a permanent magnet to generate a magnetic field, two permanent magnets are arranged in a spaced relation with the same polarity poles of the permanent magnets facing each other. An antenna for radiating electromagnetic waves and the two permanent magnets are arranged in a coaxial relation, and the electromagnetic waves are supplied from the center of a cusp-shaped magnetic field, thereby forming plasma with practically usable frequency over a wide region.

More specifically, the lines of magnetic force generated from the permanent magnets pass through an outer sleeve and form a resonance magnetic field in a vacuum vessel. Interaction between the resonance magnetic field formed in the vacuum vessel outside the outer sleeve and the electromagnetic waves radiated from the antenna develops electron cyclotron resonance, whereupon a rarefied gas in the vacuum vessel is ionized to produce plasma around the two permanent magnets. Even an article having a relatively wide surface area can be uniformly processed with the plasma thus produced. In addition, the apparatus of the present invention also maintains the advantageous properties specific to the ECR type plasma generating apparatus employing a permanent magnet, such as a capability of producing moderate and soft plasma suited to carry out surface reforming and surface treatment without damaging workpieces, which are obtained by the above-cited Japanese Patent No. 2,011,461 and NO. 2,080,292.

Details of the present invention will be described below in conjunction with Examples. It is to be noted that Examples should not be interpreted as limiting the scope of the present invention.

REFERENCE EXAMPLE

Figure 4:
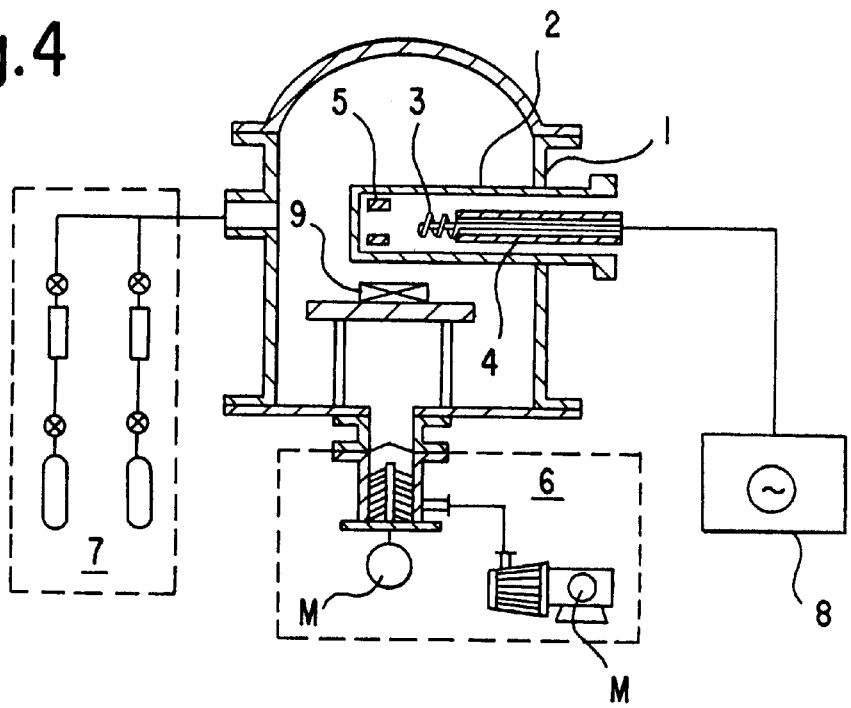
FIG. 4 is a schematic view showing Reference Example.
Figure 5:
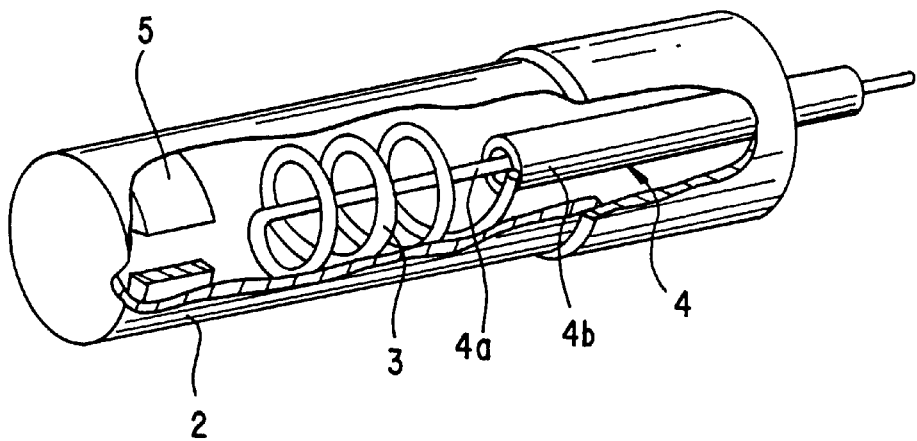
FIG. 5 is an enlarged perspective view of part of FIG. 4.

First, the basic construction and operation will be described below, taking the plasma generating apparatus disclosed in the above-cited Japanese Patent NO. 2,080,292 as a reference example. FIG. 4 is a schematic view showing Reference Example, and FIG. 5 is an enlarged perspective view of part of FIG. 4.

A tubular outer sleeve 2 is attached to a side wall of a vacuum vessel 1 and is extended to the inside of the vacuum vessel 1. The outer sleeve 2 is made of a material, e.g., a ceramic, which is permeable to electromagnetic waves and lines of magnetic force, and has air tightness. A spiral antenna 3 is accommodated in the outer sleeve 2. The antenna 3 has opposite ends connected respectively to an inner conductor 4a and an outer conductor 4b of a coaxial waveguide 4. A permanent magnet 5 for forming a resonance magnetic field is also accommodated in the outer sleeve 2 forwardly of the antenna 3. In a plasma generating apparatus thus constructed, an inner space of the vacuum vessel 1 is evacuated into a high-vacuum state with a vacuum evacuating system 6, and a film forming gas, for example, supplied from a gas supply system 7 is then filled in the inner space of the vacuum vessel 1. When high-frequency electric power is supplied to the antenna 3 from a high-frequency oscillator 8 through the coaxial waveguide 4, electromagnetic waves are radiated from the antenna 3. The radiated electromagnetic waves pass through the outer sleeve 2 and interact with the resonant magnetic field generated by the permanent magnet 5, thereby developing an electron cyclotron resonance phenomenon to produce plasma. In the case of the filled gas being a film forming gas, solid species created with ionization upon the generation of plasma are deposited on a substrate 9 to form a thin film. If an etching gas is employed in place of the film forming gas, the substrate 9 is etched.

Example

Figure 1:
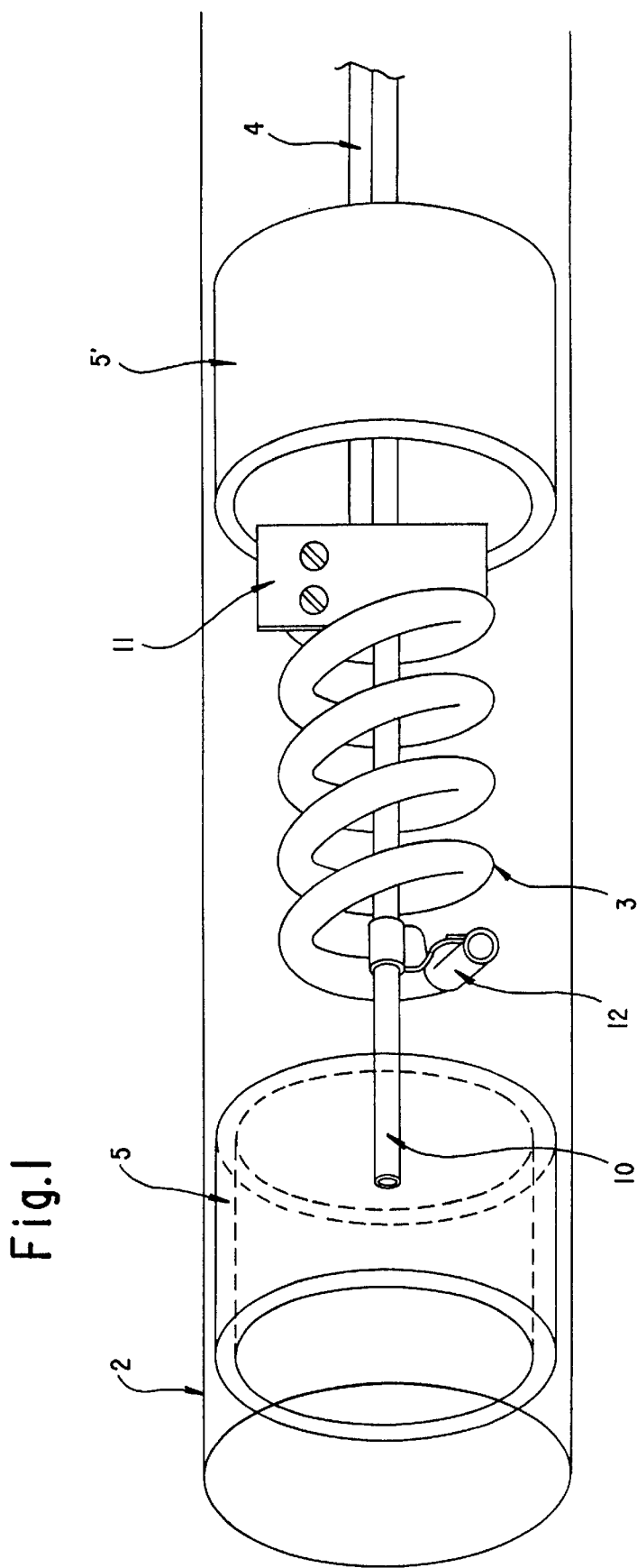
FIG. 1 is a schematic perspective view showing an example of the present invention.

An example of the present invention will be described below. FIG. 1 is a schematic perspective view showing an example of the present invention.

Two permanent magnets 5 and 5' for forming a resonance magnetic field are arranged in an outer sleeve 2, which is similar to that employed in above Reference Example, in a spaced relation with the same polarity poles of the permanent magnets facing each other. An antenna (coil) 3 is arranged in a space between the permanent magnets 5 and 5'. A coaxial waveguide cable 4 for supplying electromagnetic waves is provided separately from a pipe 10 through which cooling air is passed, and electric power is supplied to the antenna 3 through a matching unit 11. Providing the matching unit 11 as shown allows the shape of the antenna 3 to be selected with a relatively high degree of flexibility, and enables design to be made with priority imposed on the resonance magnetic field. For holding the antenna 3 in a stable condition, a terminal end of the antenna 3 can be secured to the cooling pipe 10 by using a fixture 12. When the fixture 12 is made of a conductor, electromagnetic waves are supplied to a surrounding space through magnetic coupling. When the fixture 12 is made of a nonconductor, impedance at the terminal end of the antenna 3 is increased so as to radiate electromagnetic waves in the form of lines of electric force to the surrounding space.

Figure 2:
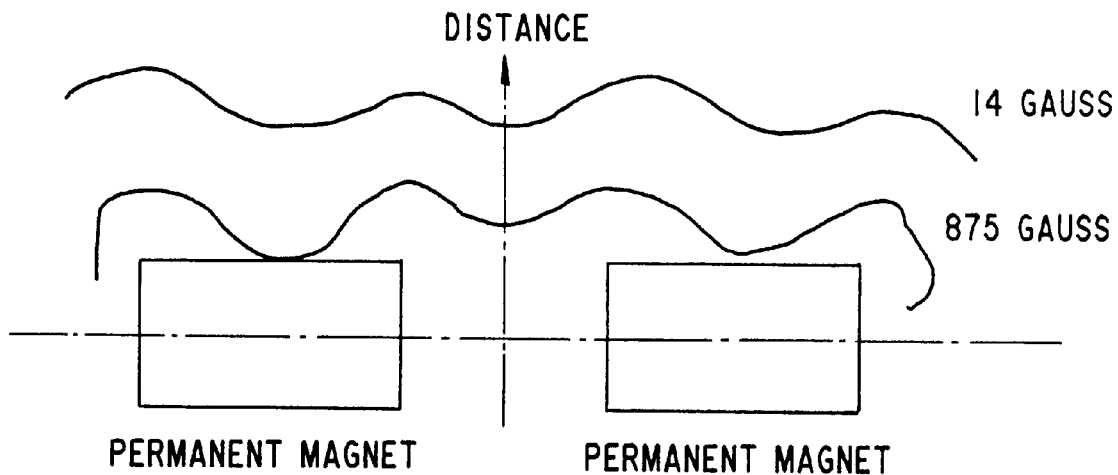
FIG. 2 is an explanatory view showing distribution of a magnetic field according to the example of the present invention.
Figure 3:
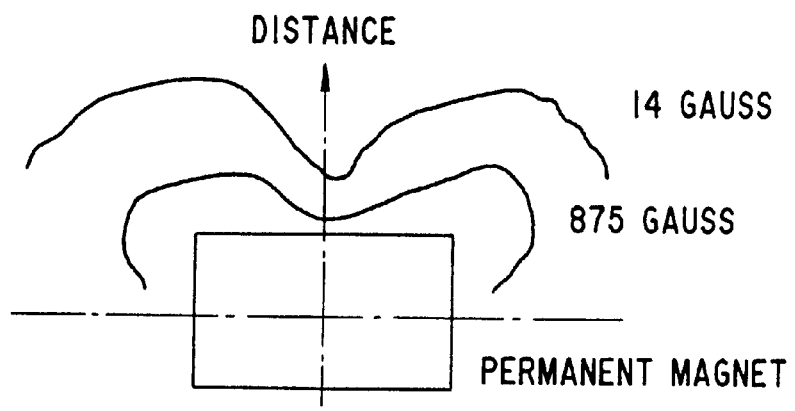
FIG. 3 is an explanatory view showing distribution of a magnetic field according to a reference example employing a single permanent magnet.

As a result of measuring the magnetic field around the permanent magnets 5 and 5' arranged as described above, it was found that the resonance magnetic field distributed as shown in FIG. 2. On the other hand, FIG. 3 shows distribution of the resonance magnetic field resulted from similar measurement for Reference Example employing one permanent magnet. As will be apparent from comparison of FIGS. 2 and 3, the resonance magnetic field generated in Example distributes over a much wider region than in Reference Example.

In FIGS. 2 and 3, numerical values of gauss as the unit of magnetic force indicate two representative resonance magnetic fields corresponding to two frequencies available by high-frequency equipment for industrial purposes More specifically, when Example shown in FIG. 1 was installed in a vacuum vessel similar to that shown in FIG. 4 and electromagnetic waves were supplied from the antenna 3, it was confirmed that ECR can be developed at the resonance magnetic field of 14 gausses by the frequency of 40.68 MHz and at the resonance magnetic field of 875 gausses by the frequency of 2.4 MHz, respectively.

As described above, the present invention has succeeded in increasing the resonance region without sacrificing the advantages of the above-cited Japanese Patent No. 2,011,461 and NO. 2,080,292. In other words, since the plasma generating apparatus of the present invention employs permanent magnets, plasma can be produced locally but a relatively wide region and the entire construction can be compacted. In addition, since the permanent magnets for generating the resonance magnetic field are accommodated in the outer sleeve being made of an insulator and permeable to lines of magnetic force and having air tightness, the following advantages are obtained. Even if gas is generated from the magnets under heating upon the generation of plasma, the generated gas does not enter the vacuum vessel; hence it is possible to avoid variations in the state of plasma produced and contamination in the vacuum vessel. Further, the permanent magnets are not directly sputtered and magnetic power is prevented from accumulating in the vacuum vessel. Additionally, since the permanent magnets are placed under the atmospheric pressure, cooling and moving of the permanent magnets can be easily performed.

What is claimed is:

1. A plasma generating apparatus utilizing electron cyclotron resonance, comprising a vacuum vessel capable of maintaining a vacuum state therein, an antenna for radiating electromagnetic waves into said vacuum vessel, a permanent magnet for forming a resonance magnetic field, and an outer sleeve made of an insulator and accommodating said permanent magnet therein, said outer sleeve being permeable to lines of magnetic force and having air tightness, wherein two permanent magnets are arranged to form the resonance magnetic field in a spaced relation with the same polarity poles of said permanent magnets facing each other.

2. The plasma generating apparatus utilizing electron cyclotron resonance according to claim 1, wherein said insulator is made of a ceramic.

3. The plasma generating apparatus utilizing electron cyclotron resonance according to claim 1, wherein said outer sleeve is permeable to electromagnetic waves, and said antenna is also accommodated in said outer sleeve.

4. The plasma generating apparatus utilizing electron cyclotron resonance according to claim 1, wherein said antenna and said two permanent magnets are arranged in a coaxial relation, and the electromagnetic waves are supplied from the center of a cusp-shaped magnetic field.

* * * * *